US 7,259,633 B2

(12) United States Patent
Lee et al.

(10) Patent No.: US 7,259,633 B2
(45) Date of Patent: Aug. 21, 2007

(54) FREQUENCY SYNTHESIZER WITH LOOP FILTER CALIBRATION FOR BANDWIDTH CONTROL

(75) Inventors: Chang-Hyeon Lee, Irvine, CA (US); Akbar Ali, Garden Grove, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 129 days.

(21) Appl. No.: 11/137,210

(22) Filed: May 24, 2005

(65) Prior Publication Data

US 2006/0267697 A1   Nov. 30, 2006

(51) Int. Cl.
*H03L 7/00* (2006.01)
*H03L 7/093* (2006.01)

(52) U.S. Cl. ............................ 331/16; 331/17; 331/25; 331/1 A; 327/157

(58) Field of Classification Search ................ 331/1 A, 331/16, 17, 44, 66, 175, 176; 327/156, 157
See application file for complete search history.

(56) References Cited

U.S. PATENT DOCUMENTS

| | | | | |
|---|---|---|---|---|
| 5,055,802 | A * | 10/1991 | Hietala et al. ................ | 331/16 |
| 5,247,265 | A * | 9/1993 | Norimatsu ................... | 331/16 |
| 6,731,145 | B1 * | 5/2004 | Humphreys et al. ........ | 327/156 |
| 7,084,709 | B1 * | 8/2006 | Leong et al. ................. | 331/11 |
| 2003/0206066 | A1 * | 11/2003 | Harwood ...................... | 331/17 |
| 2004/0051590 | A1 * | 3/2004 | Perrott et al. ............... | 331/1 A |

OTHER PUBLICATIONS

Lee at al, *A Fully Integrated GMSK Modulator Using BiCMOS Σ-Δ Frequency Synthesizer with Automatic Loop Gain Calibration*, RFIC Symposium (2005).
Lee at al, *A 0.18um SiGe BiCMOS UHF VCO with Auto Tuning for DCT AMPS and CDMA Application*, RFIC Symposium (2004).

\* cited by examiner

*Primary Examiner*—Robert Pascal
*Assistant Examiner*—Ryan J Johnson
(74) *Attorney, Agent, or Firm*—Farjami & Farjami LLP

(57) ABSTRACT

According to one exemplary embodiment, a frequency synthesizer module includes a loop filter, where the loop filter includes a capacitor having a first terminal and a second terminal. The frequency synthesizer module further includes a loop filter calibration module coupled to the capacitor in the loop filter. The loop filter calibration module causes an initial capacitance between the first terminal and the second terminal of the capacitor to increase to a target capacitance when the loop filter is in a calibration mode. The target capacitance can causes in increase in control of a bandwidth of the loop filter and a reduction in percent error of a unity gain bandwidth of the loop filter. The loop filter further includes a switched capacitor array configured to cause the initial capacitance to increase to the target capacitance in response to a digital feedback signal provided by the loop filter calibration module.

21 Claims, 2 Drawing Sheets

FREQUENCY SYNTHESIZER WITH LOOP FILTER CALIBRATION FOR BANDWIDTH CONTROL

BACKGROUND OF THE INVENTION

1. Field of the Invention

The present invention is generally in the field of electrical circuits. More particularly, the invention is in the field of frequency synthesizers.

2. Related Art

Modulated frequency synthesizers, such as analog modulated frequency synthesizers, are utilized in cellular communication systems, such as Global System for Mobility ("GSM") cellular communication systems. In a modulated frequency synthesizer, data is modulated by switching a value of a frequency divider, such as a fractional-N frequency divider, in the feedback path of a phase locked loop. Modulated frequency synthesizers, such as analog modulated synthesizers, often employ a pre-emphasis on the data path to compensate for bandpass filtering caused by the phase locked loop. However, if data pre-emphasis is used, the bandwidth of the loop filter in the modulated frequency synthesizer must be accurately controlled to meet required communication system, such as GSM communication system, specifications.

Modulated frequency synthesizers generally utilize a loop filter that includes passive components, such as resistors and capacitors. These passive components are subject to process and temperature variations, which can cause an undesirable change in the bandwidth of the loop filter. For example, the loop filter typically includes a large capacitor in series with a resistor, where the large capacitor can have a significant undesirable effect on loop filter bandwidth as a result of process and temperature variations.

Thus, there is a need in the art for increased loop filter bandwidth control in a modulated frequency synthesizer, such as an analog modulated synthesizer.

SUMMARY OF THE INVENTION

The present invention is directed to frequency synthesizer with loop filter calibration for increased bandwidth control. The present invention overcomes the need in the art for increased loop filter bandwidth control in a modulated frequency synthesizer, such as an analog modulated synthesizer.

According to one exemplary embodiment, a frequency synthesizer module includes a loop filter, where the loop filter includes a capacitor having a first terminal and a second terminal. For example, the frequency synthesizer module may be a Gaussian minimum shift keying modulated frequency synthesizer. The frequency synthesizer module further includes a loop filter calibration module coupled to the capacitor in the loop filter. The loop filter calibration module causes an initial capacitance between the first terminal and the second terminal of the capacitor to increase to a target capacitance when the loop filter is in a calibration mode. The target capacitance can cause in increase in control of a bandwidth of the loop filter.

According to one exemplary embodiment, the target capacitance can cause a reduction in percent error of a unity gain bandwidth of the loop filter. The loop filter further includes a switched capacitor array coupled between the first terminal and the second terminal of the capacitor, where the switched capacitor array is configured to cause the initial capacitance to increase to the target capacitance in response to a digital feedback signal provided by the loop filter calibration module. The loop filter calibration module includes an oscillator, where the oscillator provides a sawtooth waveform at the first terminal of the capacitor when the loop filter is in the calibration mode.

According to this exemplary embodiment, the loop filter calibration module further includes a binary search block, where the binary search block is configured to receive a digital voltage error signal and output the digital feedback signal. The loop filter calibration module further includes a phase error to voltage error converter coupled to the binary search block, where the phase error to voltage error converter is configured to receive up and down phase error signals and output the digital voltage error signal. The frequency synthesizer module further includes a voltage controlled oscillator module coupled to the loop filter, where the voltage controlled oscillator module is configured to generate an output signal in response to a tuning voltage outputted by the loop filter.

The frequency synthesizer module further includes a divider module coupled to the voltage controlled oscillator module, where the divider module is configured to receive the output signal from the voltage controlled oscillator module, divide the output signal by a number than is greater than zero and less than one, and output a feedback signal. Other features and advantages of the present invention will become more readily apparent to those of ordinary skill in the art after reviewing the following detailed description and accompanying drawings.

DETAILED DESCRIPTION OF THE INVENTION

The present invention is directed to frequency synthesizer with loop filter calibration for increased bandwidth control. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention provides an innovative loop filter calibration module for calibrating a loop filter in a frequency synthesizer. Although an analog modulated frequency synthesizer is utilized in the present embodiment to illustrate the invention, the present invention's loop filter calibration module can be applied to other types of frequency synthesizers to provide loop filter calibration for increased loop bandwidth control. In general, the present invention's loop filter calibration module can be applied to fractional-N frequency synthesizers, which are utilized in a wide variety of applications.

Figure 1:
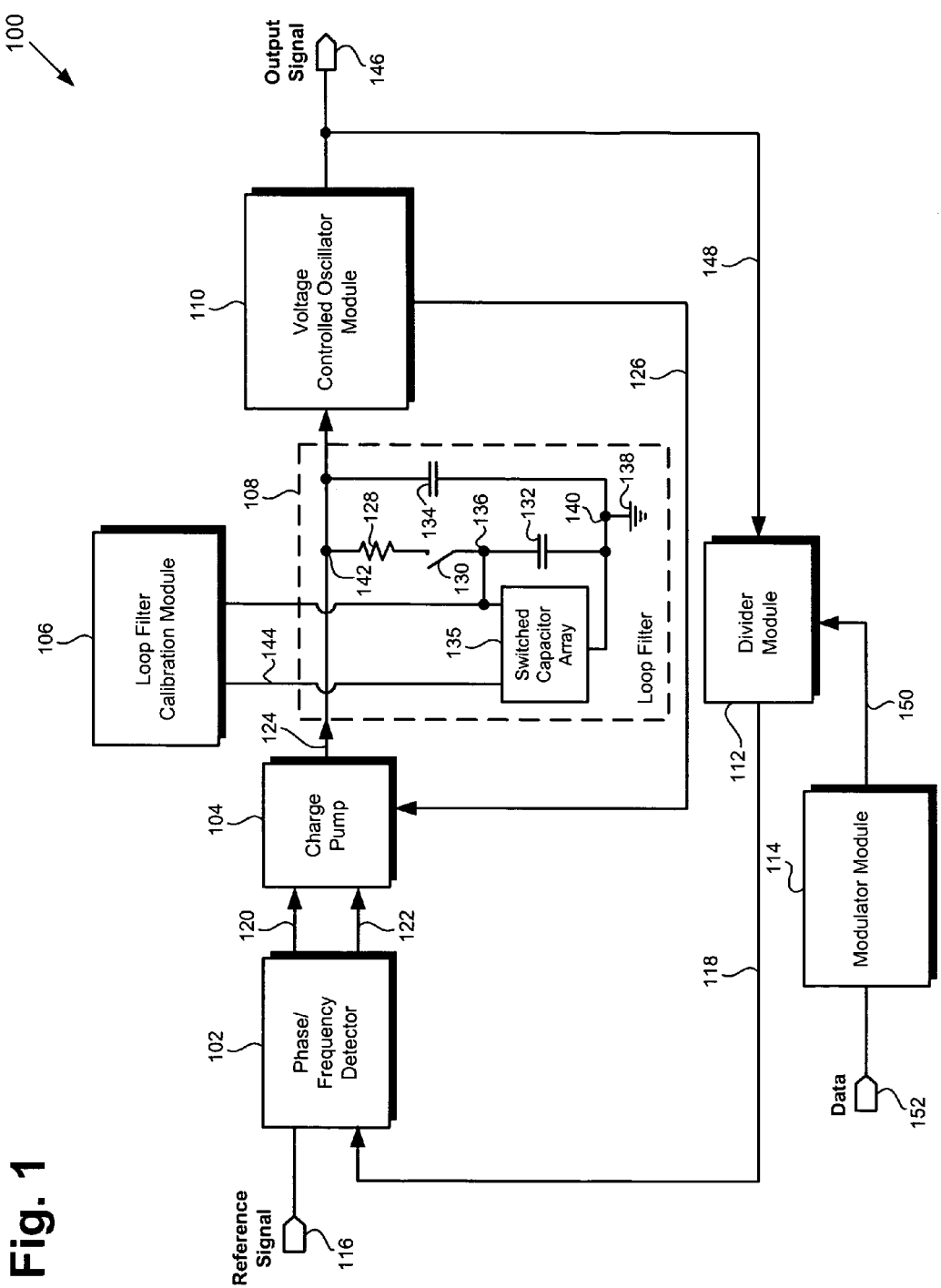
FIG. 1 is a block diagram of an exemplary frequency synthesizer module including an exemplary loop filter calibration module in accordance with one embodiment of the present invention.

FIG. 1 shows a block diagram of an exemplary frequency synthesizer module including an exemplary loop filter calibration module in accordance with one embodiment of the present invention. Certain details and features have been left out of FIG. 1 that are apparent to a person of ordinary skill in the art. Frequency synthesizer module 100 includes phase/frequency detector 102, charge pump 104, loop filter calibration module 106, loop filter 108, voltage controlled oscillator module 110, divider module 112, and modulator module 114. Loop filter 108 further includes resistor 128, switch 130, capacitors 132 and 134, and switched capacitor array 135. Frequency synthesizer module 100 can comprise an analog modulated frequency synthesizer, such as a Gaussian minimum shift keying ("GMSK") modulated sigma-delta ("Δ-υ") frequency synthesizer. In one embodiment, frequency synthesizer module 100 can comprise an unmodulated fractional-N frequency synthesizer. In other embodiments, frequency synthesizer module 100 can comprise other types of modulated frequency synthesizers.

As shown in FIG. 1, reference signal 116 is coupled to one input of phase/frequency detector 102 and a feedback signal, which is outputted by divider module 112, is coupled to another input of phase/frequency detector 102 via line 118. Phase/frequency detector 102 can be configured to receive reference signal 116 at one input and receive the feedback signal that is outputted by divider module 112 at another input, and compare the phase of reference signal 116 with the phase of the feedback signal that is outputted by divider module 112. Phase/frequency detector 102 can be further configured to output an up phase error signal on line 120 when the phase of the feedback signal is leading the phase of reference signal 116 and to output a down phase error signal on line 122 when the phase of the feedback signal is lagging the phase of reference signal 116. The difference between the up phase error signal and the down phase error signal is proportional to the phase difference between reference signal 116 and the feedback signal that is outputted by divider module 112.

Also shown in FIG. 1, charge pump 104 is coupled to phase/frequency detector 102. Charge pump 104 can be configured to receive up and down phase error signals on respective lines 120 and 122, convert the up and down phase error signals to a correction signal, and output the correction signal to loop filter 108. Charge pump 104 can also be configured to provide a charge pump current ("$I_{cp}$") on line 124, which can be represented by the equation:

$$I_{cp} = V_{BG}/R_{BG} \qquad \text{equation (1)}$$

where "$V_{BG}$" is a bandgap voltage, which is process and temperature independent, and "$R_{BG}$" is the resistance of an internal resistor in charge pump 104. Charge pump 104 can also receive a voltage controlled oscillator ("VCO") gain correction signal from voltage controlled oscillator module 110 on line 126.

Further shown in FIG. 1, loop filter 108 is coupled to charge pump 104 and can be configured to receive a correction signal from charge pump 104 via line 124 and generate a tuning voltage ("VTUNE"), which is outputted to voltage controlled oscillator module 110. As shown in FIG. 1, loop filter 108 comprises resistor 128, switch 130, capacitors 132 and 134, and switched capacitor array 135. As further shown in FIG. 1, a first terminal of resistor 128 and a first terminal of capacitor 134 are coupled to node 142 and a second terminal of resistor 128 is coupled to a first terminal of switch 130. Switch 130 can be configured to be in an open position in a calibration mode of loop filter 108, which is initiated when loop filter calibration module 106 is powered on, and in a closed position when loop filter 108 is in a normal operating mode.

Also shown in FIG. 1, a second terminal of switch 130 is coupled to a first terminal of capacitor 132 at node 136 and a second terminal of capacitor 132 and a second terminal of capacitor 134 are coupled to ground 138 at node 140. In loop filter 108, the capacitance of capacitor 132 is significantly larger than the capacitance of capacitor 134. Capacitor 132 is selected to have a capacitance that is smaller than a desired target capacitance, which is provided between nodes 136 and 140 by loop filter calibration module 106 during calibration of loop filter 108. By way of example, capacitor 132 might have a capacitance that is approximately 10.0 percent smaller than the target capacitance. However, capacitor 132 might have a capacitance that is larger or smaller than 10.0 percent of the target capacitance.

Further shown in FIG. 1, a first terminal of switched capacitor array 135 is coupled to an oscillator output signal of loop filter calibration module 106 at node 136, a second terminal of switched capacitor array 135 is coupled to ground 138 at node 140, and a third terminal of switched capacitor array 135 is coupled to an output of a binary search block (not shown in FIG. 1) in loop filter calibration module 106 via line 144. Switched capacitor array 135 can comprise can comprise an appropriate number of capacitors, which can be individually turned on or off by an N-bit digital feedback signal received from loop filter calibration module 106 via line 144. The N-bit digital feedback signal received by switched capacitor array 135 can select which capacitors will be turned on or off and, thereby, can determine the capacitance of switched capacitor array 135. During a calibration mode of loop filter 108, the capacitance of switched capacitor array 135 can be selected such that the total capacitance between nodes 136 and 140 is equal to a desired target capacitance. At the start of the calibration mode, the initial capacitance between nodes 136 and 140 is equal to the capacitance of capacitor 132. In other embodiments, loop filter 108 may also include additional passive components, which are not shown in FIG. 1. For example, loop filter 108 may include one or more resistors in addition to resistor 128 and/or one or more capacitors in addition to capacitors 132 and 134.

Loop filter calibration module 106 can be configured to calibrate loop filter 108 when switch 130 is in an open position, which occurs when loop filter calibration module 106 is powered on. Loop filter calibration module 106 can be further configured to calibrate loop filter 108 by causing the capacitance of loop filter 108 between nodes 136 and 140 (i.e. between the first and second terminals of capacitor 132) to increase from an initial capacitance, which is equal to the capacitance of capacitor 132, to a target capacitance, which is determined by the sum of the capacitance of switched capacitor array 135 and the capacitance of capacitor 132. The target capacitance can be determined to provide a reduction in error percentage of the unity gain bandwidth of loop filter 108. By way of example, the target capacitance can be determined to provide a unity gain bandwidth error of ±3.0%, which meets GSM communication specifications.

By way of background, unity gain bandwidth can be approximated by the equation:

$$\text{Unity gain bandwidth} = I_{cp} \cdot R_1 \cdot C_1 \cdot K_V / 2\pi N(C_1 + C_2) \quad \text{equation (2)}$$

where $I_{cp} = V_{BG}/R_{BG}$ (from equation (1)), "$R_1$" is the resistance of resistor 128, "$C_1$" is the capacitance of capacitor 132, "$K_V$" is the gain of voltage controlled oscillator module 110, and "$C_2$" is the capacitance of capacitor 134. $R_1$ can be selected to match $R_{BG}$ such that the product of $I_{cp} \times R_1$ can be made approximately constant and $K_V$ can be appropriately calibrated to minimize variations in the unity gain bandwidth. However, process and temperature variations in $C_1$ can cause significant undesirable variations in the unity gain bandwidth. By way of example, a ±20.0% variation in $C_1$ (i.e. the capacitance of capacitor 132 in loop filter 108, can cause a ±4.5% change in the unit gain bandwidth. However, by utilizing loop filter calibration module 106 to calibrate loop filter 108 such that the capacitance between nodes 136 and 140 is equal to a target capacitance, the variation in unity gain bandwidth caused by variations (i.e. process and temperature variations) in $C_1$ can be significantly reduced. By way of example, the variation in unity gain bandwidth due to variations in $C_1$ can be reduced to ±0.2% by calibrating loop filter 108. Thus, by utilizing loop filter calibration module 106 to calibrate loop filter 108, the present invention achieves a reduction in variations in the bandwidth of loop filter 108 and, thereby advantageously achieves increased control of the loop filter bandwidth.

Also shown in FIG. 1, voltage controlled oscillator module 110 is coupled to loop filter 108 and can comprise an analog voltage controlled oscillator. Voltage controlled oscillator module 110 can be configured to receive VTUNE (i.e. a control voltage) from loop filter 108 and generate output signal 146. Voltage controlled oscillator module 110 can include a VCO automatic tuning circuit, which can comprise a digital phase locked loop. Voltage controlled oscillator module 110 can further include a VCO gain correction circuit, which can provide a VCO correction signal to charge pump 104 via line 126. Further shown in FIG. 1, output signal 146, which is outputted by voltage controlled oscillator module 110, is coupled to the input of divider module 112 on line 148.

Divider module 112 can be configured to receive output signal 146 from voltage controlled oscillator module 110 on line 148 and an output signal from modulator module 114 on line 150, divide the frequency of output signal 146 by "N," where "N" is a fraction having a value of between 0.0 and 1.0, and output a feedback signal to phase/frequency detector 102 via line 118. Indirect modulation of voltage controlled oscillator module 110 can be achieved by appropriately changing feedback divider "N" via the output signal from modulator module 114. Also shown in FIG. 1, modulator module 114 is coupled to divider module 112 and is configured to receive data 152, appropriate process data 152, which can include data pre-emphasis, and provide an output signal to divider module 112. Modulator module 114 can comprise an analog modulator, such as a GMSK modulator. In another embodiment, modulator module 114 can comprise a different type of modulator.

Figure 2:
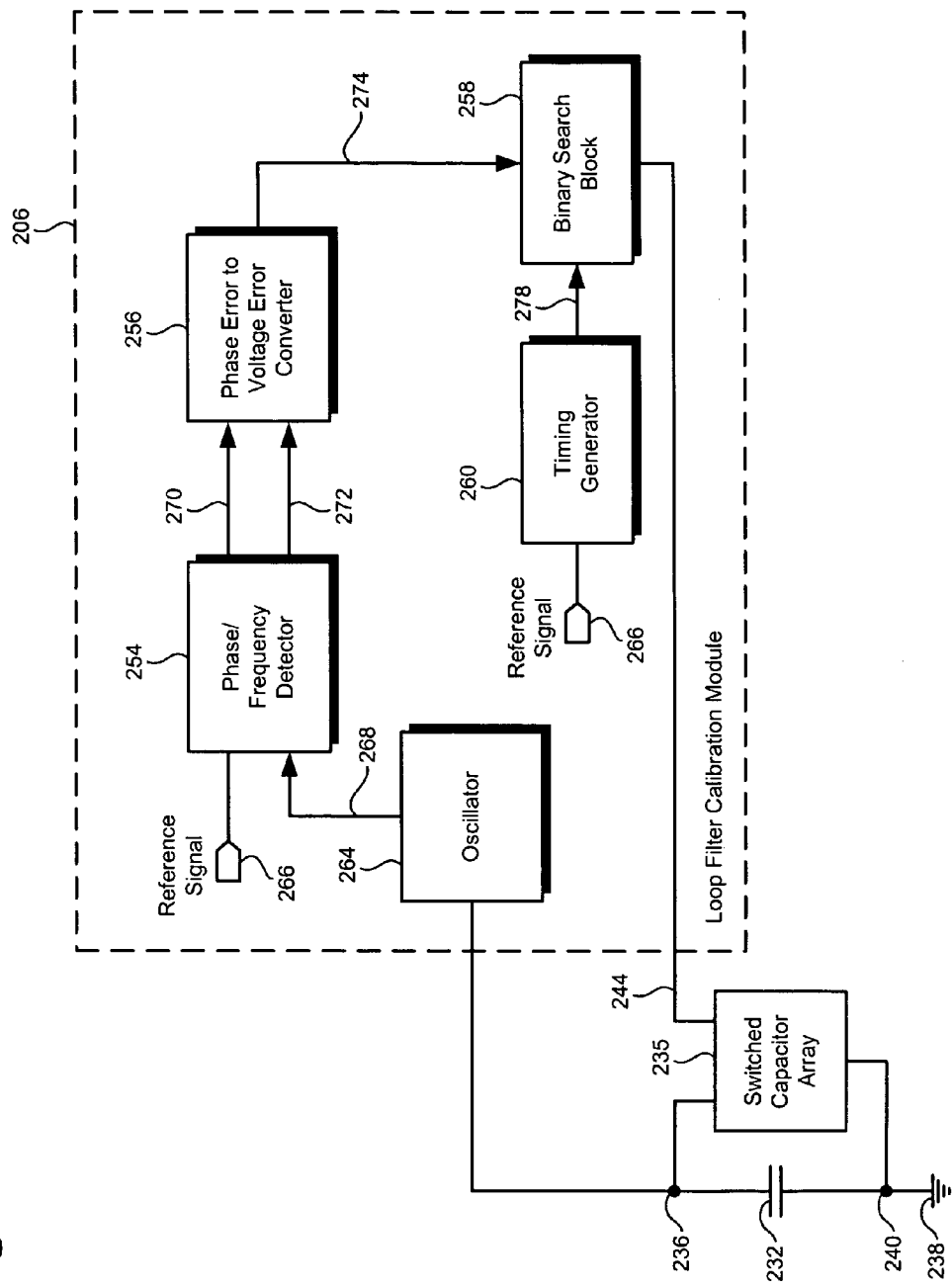
FIG. 2 illustrates a block diagram of an exemplary loop filter calibration module in accordance with one embodiment of the present invention.

FIG. 2 shows a block diagram of an exemplary loop filter calibration module coupled to an exemplary loop filter capacitor and switched capacitor array in accordance with one embodiment of the present invention. Loop filter calibration module 206, capacitor 232, switched capacitor array 235, ground 238, nodes 236 and 240, and line 244 in FIG. 2 correspond, respectively, to loop filter calibration module 106, capacitor 132, switched capacitor array 135, ground 138, nodes 136 and 140, and line 144 in FIG. 1. Loop filter calibration module 206 comprises phase/frequency detector 254, phase error to voltage error converter 256, binary search block 258, timing generator 260, and oscillator 264.

As shown in FIG. 2, reference signal 266 is coupled to one input of phase/frequency detector 254 and an output signal from oscillator 264 is coupled to another input of phase/frequency detector 254 via line 268. Phase/frequency detector 254 can be configured to receive reference signal 266 at one input and receive the oscillator output signal at another input, and compare the phase of reference signal 266 with the phase of the output signal, which is generated by oscillator 264. Phase/frequency detector 254 can be further configured to output an up phase error signal on line 270 when the phase of the oscillator output signal is leading the phase of reference signal 266 and to output a down phase error signal on line 272 when the phase of the oscillator output signal is lagging the phase of reference signal 266. The difference between the up phase error signal and the down phase error signal is proportional to the phase difference between reference signal 266 and the oscillator output signal.

Also shown in FIG. 2, phase error to voltage error converter 256 is coupled to phase/frequency detector 254 via lines 270 and 272. Phase error to voltage error converter 256 can be configured to receive the up and down phase error signals on respective lines 270 and 272 and convert the up and down phase error signals to a voltage error signal, which is a digital error signal. A charge pump and capacitor can be utilized in phase error to voltage error converter 256 to convert the up and down phase error signals to the voltage error signal, which is outputted on line 274. Further shown in FIG. 2, binary search module 258 is coupled to phase error to voltage error converter 256 via line 274. Binary search module 258 can be configured to receive the voltage error signal (i.e. a digital error signal) from phase error to voltage error converter 256 and output an N-bit digital feedback signal to switched capacitor array 235 via line 276. The number of bits in the N-bit digital feedback signal is determined by the tuning range of switched capacitor array 235.

Also shown in FIG. 2, timing generator 260 is coupled to binary search block 258. Timing generator 260 can be configured to receive reference signal 266, which determines a frequency range of timing generator 260, and provide an output signal to binary search block 258 via line 278. Timing generator 260 is controlled by a power on reset circuit (not shown in FIG. 2), which allows timing generator 260 to start when loop filter calibration module 206 is powered on. Further shown in FIG. 2, a third terminal of switched capacitor array 235 is coupled to binary search block 258 via line 244, a first terminal of switched capacitor array 235 is coupled to oscillator 264 and a first terminal of capacitor 232 at node 236, and a second terminal of switched capacitor array 235 is coupled to ground 238 at node 240. As discussed above, during a calibration mode of loop filter 108 in FIG. 1, the capacitance of switched capacitor array 235 is selected such that the total capacitance between nodes 236 and 240 is equal to a desired target capacitance.

Oscillator 264 can comprise a low frequency oscillator and can be configured to generate an output signal, which is coupled to an input of phase/frequency detector 254 and to node 236. The output signal has a sawtooth waveform with an approximate 50.0 percent duty cycle and has a frequency ("$F_{OSC}$") that can be represented by the equation:

$$F_{OSC} = (V_{BG}/R_{EXT})/(C^*\Delta V) \quad \text{equation (3)}$$

where "$R_{EXT}$" is an external reference resistor, "VBG" is a bandgap voltage, which is process and temperature independent, "C" is the capacitance between node 236 and node 240 (i.e. ground 238), and "$\Delta V$" is the difference in voltage between the high voltage point and the low voltage point of the sawtooth waveform generated by oscillator 264. The output signal (i.e. the sawtooth waveform) of oscillator 264 is generated from a bandgap current source which provides a current that is equal to $V_{BG}/R_{EXT}$. By way of example, the output signal generated by oscillator 264 may have a frequency of approximately 130.0 kHz. However, oscillator 264 may also generate an output signal having a frequency that is higher or lower than 130.0 kHz.

The operation of loop filter calibration module 206 will now be discussed. A calibration mode of loop filter 108 in FIG. 1 is automatically initiated when loop filter calibration module 206 is powered on, which occurs at power on of frequency synthesizer module 100 in FIG. 1. At the start of the loop filter calibration mode, switch 130 is opened to disconnect (i.e. electrically isolate) capacitor 232 and switched capacitor array 235 from loop filter 108. An output signal having a sawtooth waveform is generated by oscillator 264 and applied at node 236 to calibrate the capacitance across capacitor 232 (i.e. the capacitance between nodes 236 and ground 238). The capacitor 232 is selected to have a smaller capacitance than a target capacitance, which is the desired final capacitance that is to be provided between nodes 236 and 240 (i.e. across capacitor 232). The capacitance of capacitor 232 can be appropriately selected to provide a desired capacitance calibration range.

The frequency of the output signal generated by oscillator 264, which is dependent on the capacitance between nodes 236 and 240 (i.e. the capacitance between first and second terminals of capacitor 232), is compared to the frequency of reference signal 266 by phase/frequency detector 254. Up and down phase error signals, which correspond to the difference in phase between reference signal 266 and the output signal generated by oscillator 264, are converted to a voltage error signal by phase error to voltage error converter 256. The voltage error signal, which is a digital error signal, is converted to an N-bit digital feedback signal by binary search block 258 and outputted to switched capacitor array 235. The tuning range of switched capacitor array 235 determines the number of bits in the N-bit digital feedback signal. Reference signal 266 is coupled to timing generator 260 to determine the frequency range of timing generator 260, which is coupled to binary search block 258.

Timing generator 260 determines the rate at which the N-bit digital feedback signal is outputted to switched capacitor array 235. For example, the N-bit digital feedback signal can be outputted to switched capacitor array 235 at the end of every 16 cycles of reference signal 266 or other appropriate number of cycles of reference signal 266. By changing the capacitance of switched capacitor array 235, the N-bit digital feedback signal also changes the frequency of oscillator 264, which is dependent on the sum of the capacitance of capacitor 232 and the capacitance of switched capacitor array 235 (i.e. the capacitance between nodes 236 and 240). The above feedback process continues until the frequency of oscillator 264 is substantially equal to the frequency of reference signal 266. By appropriately selecting the frequency of reference signal 266, the sum of the capacitance of switched capacitor array 235 and the capacitance of capacitor 232 can be made substantially equal to a target capacitance when the frequency of oscillator 264 is substantially equal to the frequency of reference signal 266. After loop filter 108 has been calibrated, switch 130 is set to the closed position, which causes loop filter 108 to operate in a normal operating mode.

Thus, by utilizing loop filter calibration module to calibrate loop filter 108 by increasing the capacitance across capacitor 232 to a target capacitance, the present invention significantly reduces the variations in the capacitance of capacitor 232 caused by process and temperature variations. However, as discussed above, process and temperature variations in capacitor 232 cause undesirable changes in the bandwidth of loop filter 108. Thus, by significantly reducing and, thereby, controlling the variations in the capacitance of capacitor 232, the present invention advantageously achieves increased control of the bandwidth of loop filter 108. Furthermore, the present invention advantageously achieves a reduction in percent error of unity gain bandwidth of the loop filter.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a frequency synthesizer with loop filter calibration for increased bandwidth control has been described.

The invention claimed is:

1. A frequency synthesizer module comprising:
   a loop filter, said loop filter comprising a capacitor having a first terminal and a second terminal;
   a loop filter calibration module coupled to said capacitor in said loop filter;
   wherein said loop filter calibration module causes an initial capacitance between said first terminal and said second terminal of said capacitor to increase to a target capacitance when said loop filter is in a calibration mode, wherein said capacitor is disconnected from said loop filter when said loop filter is in said calibration mode.

2. The frequency synthesizer module of claim 1 wherein said target capacitance causes a reduction in percent error of a unity gain bandwidth of said loop filter.

3. The frequency synthesizer module of claim 1 wherein said loop filter further comprises a switched capacitor array coupled between said first terminal and said second terminal of said capacitor, wherein said switched capacitor array is configured to cause said initial capacitance to increase to said target capacitance in response to a digital feedback signal provided by said loop filter calibration module.

4. The frequency synthesizer module of claim 1 wherein said target capacitance causes an increase in control of a bandwidth of said loop filter.

5. The frequency synthesizer module of claim 1 wherein said loop filter calibration module comprises an oscillator, wherein said oscillator provides a sawtooth waveform at said first terminal of said capacitor when said loop filter is in said calibration mode.

6. The frequency synthesizer module of claim 3 wherein said loop filter calibration module comprises a binary search block, wherein said binary search block is configured to receive a digital voltage error signal and output said digital feedback signal.

7. The frequency synthesizer module of claim 6 wherein said loop filter calibration module further comprises a phase error to voltage error converter coupled to said binary search block, wherein said phase error to voltage error converter is configured to receive up and down phase error signals and output said digital voltage error signal.

8. The frequency synthesizer module of claim 1 further comprising a voltage controlled oscillator module coupled to said loop filter, wherein said voltage controlled oscillator module is configured to generate an output signal in response to a tuning voltage outputted by said loop filter.

9. The frequency synthesizer module of claim 8 further comprising a divider module coupled to said voltage controlled oscillator module, wherein said divider module is configured to receive said output signal from said voltage controlled oscillator module, divide said output signal by a number than is greater than zero and less than one, and output a feedback signal.

10. The frequency synthesizer module of claim 1 wherein said frequency synthesizer module comprises a Gaussian minimum shift keying modulated frequency synthesizer.

11. A loop filter calibration module coupled to a loop filter in a frequency synthesizer module, said loop filter calibration module comprising:
   an oscillator, said oscillator coupled to a capacitor in said loop filter, said oscillator being configured to generate an output signal having a sawtooth waveform;
   wherein said loop filter calibration module causes an initial capacitance between a first terminal and a second terminal of said capacitor to increase to a target capacitance when said loop filter is in a calibration mode.

12. The loop filter calibration module of claim 11 wherein said capacitor is disconnected from said loop filter when said loop filter is in said calibration mode.

13. The loop filter calibration module of claim 11 wherein said target capacitance causes a reduction in percent error of a unity gain bandwidth of said loop filter.

14. The loop filter calibration module of claim 11 wherein said loop filter further comprises a switched capacitor array coupled between said first terminal and said second terminal of said capacitor, wherein said switched capacitor array is configured to cause said initial capacitance to increase to said target capacitance in response to a digital feedback signal provided by said loop filter calibration module.

15. The loop filter calibration module of claim 11 wherein said target capacitance causes an increase in control of a bandwidth of said loop filter.

16. The loop filter calibration module of claim 11 further comprising a phase/frequency detector coupled to said oscillator, wherein said phase/frequency detector is configured to receive said output signal from said oscillator and a reference signal and output an up phase error signal and a down phase error signal.

17. The loop filter calibration module of claim 16 further comprising a phase error to voltage error converter coupled to said phase/frequency detector, wherein said phase error to voltage error converter is configured to receive and convert said up phase error signal and said down phase error signal to a voltage error signal.

18. The loop filter calibration module of claim 17 further comprising a binary search block coupled to said phase error to voltage error converter, wherein said binary search block is configured to receive said voltage error signal and output a digital feedback signal to said loop filter.

19. The loop filter calibration module of claim 11 wherein said loop filter further comprises a resistor coupled to said capacitor, wherein said resistor is disconnected from said capacitor in said calibration mode.

20. The loop filter calibration module of claim 11 wherein said frequency synthesizer comprises a modulated frequency synthesizer.

21. A frequency synthesizer module comprising:
   a loop filter, said loop filter comprising a capacitor having a first terminal and a second terminal;
   a loop filter calibration module coupled to said capacitor in said loop filter, said loop filter calibration module comprising an oscillator;
   wherein said loop filter calibration module causes an initial capacitance between said first terminal and said second terminal of said capacitor to increase to a target capacitance when said loop filter is in a calibration mode, wherein said oscillator provides a sawtooth waveform at said first terminal of said capacitor when said loop filter is in said calibration mode.

* * * * *